(12) United States Patent
Arai

(10) Patent No.: US 11,011,453 B2
(45) Date of Patent: May 18, 2021

(54) COOLING APPARATUS, SEMICONDUCTOR MODULE, VEHICLE, AND MANUFACTURING METHOD

(71) Applicant: FUJI ELECTRIC CO., LTD., Kanagawa (JP)

(72) Inventor: Nobuhide Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 70 days.

(21) Appl. No.: 16/390,005

(22) Filed: Apr. 22, 2019

(65) Prior Publication Data

US 2019/0363036 A1    Nov. 28, 2019

(30) Foreign Application Priority Data

May 25, 2018  (JP) .............................. JP2018-100796

(51) Int. Cl.
    *H01L 23/473*    (2006.01)
    *H01L 21/48*     (2006.01)
    *H01L 23/367*    (2006.01)
    *H01L 25/07*     (2006.01)

(52) U.S. Cl.
    CPC ........ *H01L 23/473* (2013.01); *H01L 21/4878* (2013.01); *H01L 23/3677* (2013.01); *H01L 25/072* (2013.01)

(58) Field of Classification Search
    CPC .................... H01L 23/46–473; H01L 23/3677
    See application file for complete search history.

(56) References Cited

U.S. PATENT DOCUMENTS

| | | | | |
|---|---|---|---|---|
| 5,055,990 A | * | 10/1991 | Miki | ..................... H01L 25/165 363/56.05 |
| 6,729,383 B1 | * | 5/2004 | Cannell | ................... F28F 3/022 165/185 |
| 2010/0172104 A1 | | 7/2010 | Yoshida | |

(Continued)

FOREIGN PATENT DOCUMENTS

| DE | 112014000898 T5 | 11/2015 |
|---|---|---|
| JP | 2003008264 A | 1/2003 |
| JP | 2015015274 A | 1/2015 |

(Continued)

OTHER PUBLICATIONS

Extended European Search Report for counterpart European Application No. 19170897.3, issued by the European Patent Office dated Oct. 16, 2019.

*Primary Examiner* — Tucker J Wright

(57) ABSTRACT

A cooling apparatus for a semiconductor module including a semiconductor chip, having a case with a top plate, a base plate, a side wall plate arranged between the top plate and the base plate, and a coolant flow-through portion surrounded by the top plate, base plate, and side wall plate; first cooling pins secured to the top plate in the coolant flow-through portion of the case; and second cooling pins secured to the top plate in the coolant flow-through portion of the case and having lengths in a thickness direction from the top plate toward the base plate greater than lengths of the first cooling pins, wherein at least one first cooling pin and at least one second cooling pin are arranged in an alternating manner, and this pattern appears repeatedly at least twice, along a first direction in a plane parallel to the top plate.

17 Claims, 14 Drawing Sheets

(56) References Cited

U.S. PATENT DOCUMENTS

2011/0094722 A1* 4/2011 Mori .................... H01L 23/473
                                                         165/181
2015/0382506 A1   12/2015 Yamada

FOREIGN PATENT DOCUMENTS

| JP | 2016225530 A | 12/2016 |
|----|--------------|---------|
| JP | 2017017133 A | 1/2017  |
| JP | 6239997 B2   | 11/2017 |

* cited by examiner

COOLING APPARATUS, SEMICONDUCTOR MODULE, VEHICLE, AND MANUFACTURING METHOD

The contents of the following Japanese patent application(s) are incorporated herein by reference:
NO. 2018-100796 filed in JP on May 25, 2018.

BACKGROUND

1. Technical Field

The present invention relates to a cooling apparatus, a semiconductor module, a vehicle, and a manufacturing method.

2. Related Art

In a conventional semiconductor module including a semiconductor element such as a power semiconductor chip, a configuration is known in which a cooling apparatus is provided, as shown in Patent Documents 1 to 3, for example.
Patent Document 1: Japanese Patent Application Publication No. 2016-225530
Patent Document 2: Japanese Patent Application Publication No. 2015-15274
Patent Document 3: Japanese Patent No. 6239997
When foreign matter becomes stuck between cooling fins, the flow of coolant is obstructed.

SUMMARY

To solve the above problem, according to a first aspect of the present invention, provided is a cooling apparatus for a semiconductor module including a semiconductor chip. The cooling apparatus may comprise a case that includes a top plate, a base plate, a side wall plate that is arranged between the top plate and the base plate, and a coolant flow-through portion surrounded by the top plate, the base plate, and the side wall plate. The cooling apparatus may comprise a plurality of first cooling pins secured to the top plate in the coolant flow-through portion of the case. The cooling apparatus may comprise a plurality of second cooling pins that are secured to the top plate in the coolant flow-through portion of the case and have lengths in a thickness direction from the top plate toward the base plate that are greater than lengths of the first cooling pins. One or more of the first cooling pins and one or more of the second cooling pins may be arranged in an alternating manner, and this pattern appears repeatedly at least twice, along a first direction in a plane parallel to the top plate.

A spatial region with a length in the thickness direction greater than or equal to 1 mm may be provided between end portions of the first cooling pins on the base plate side and the base plate.

The first cooling pins and the second cooling pins may be arranged in a predetermined cooling fin region. The spatial region may be provided continuously traversing the cooling fin region, in a predetermined linear direction.

Width of the spatial region in a direction perpendicular to both the linear direction and the thickness direction may be greater than or equal to 1 mm.

One or more of the first cooling pins and one or more of the second cooling pins may be arranged in an alternating manner, and this pattern appears repeatedly at least twice, along a second direction that is different from the first direction.

A plurality of the first cooling pins may be arranged between the second cooling pins in at least one of the first direction and the second direction.

The first cooling pins and the second cooling pins may be arranged at a predetermined first interval in a longitudinal direction of the top plate. A distance between the side wall plate and the cooling pin arranged at an end in the longitudinal direction may be greater than or equal to double the first interval.

The top plate may include a bottom surface to which the plurality of first cooling pins and the plurality of second cooling pins are secured and a top surface opposite the bottom surface. A recessed portion may be provided in at least a portion of a region of the top surface overlapping with the plurality of first cooling pins or the plurality of second cooling pins.

The top plate may include a peripheral portion that surrounds the recessed portion, and thickness of the peripheral portion in the thickness direction may be greater than thickness of the recessed portion.

The top plate may be a single continuous plate member.

The top plate may include a lower plate-shaped portion that is shaped as a plate including a top surface and a bottom surface, and has the plurality of first cooling pins and the plurality of second cooling pins secured to the bottom surface thereof. The top plate may include an upper frame-shaped portion that is secured to the top surface of the lower plate-shaped portion and is provided with a penetration opening in a region corresponding to the recessed portion.

The top plate may include a plurality of recessed portions, each recessed portion being the recessed portion, and an intermediate region (or intermediate portion) sandwiched between two of the recessed portions. A third cooling pin, whose length in the thickness direction is less than the lengths of the first cooling pins, may be arranged at a position overlapping with the intermediate region (or intermediate portion).

According to a second aspect of the present invention, provided is a semiconductor module comprising the cooling apparatus according to the first aspect and a semiconductor device arranged above the top plate According to a third aspect of the present invention, provided is a vehicle comprising the semiconductor module according to the second aspect.

According to a fourth aspect of the present invention, provided is a manufacturing method for manufacturing the cooling apparatus according to the first aspect provided with the recessed portion in the top plate. The manufacturing method may include forming the recessed portion by forging.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
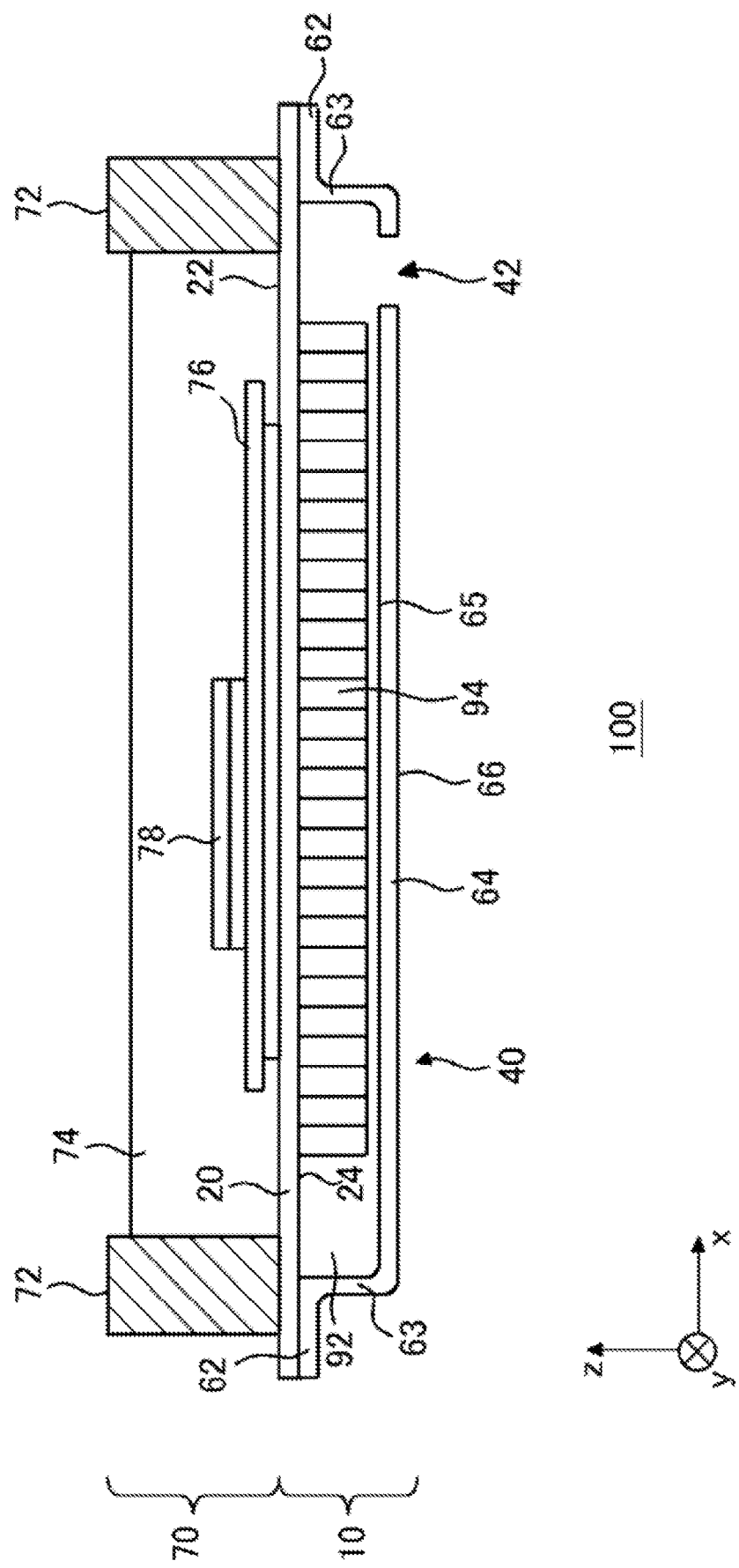
FIG. 1 is a schematic cross-sectional view of an example of a semiconductor module 100 according to one embodiment of the present invention.

FIG. 1 is a schematic cross-sectional view of an example of a semiconductor module 100 according to one embodiment of the present invention. The semiconductor module 100 includes a semiconductor device 70 and a cooling apparatus 10. The semiconductor device 70 of the present example is arranged on the cooling apparatus 10. In this specification, the plane of the cooling apparatus 10 on which the semiconductor device 70 is arranged is the xy plane, and the plane perpendicular to this xy plane is along the z axis. In this specification, the direction from the cooling apparatus 10 toward the semiconductor device 70 in the z-axis direction is referred to as "up", and the opposite direction is referred to as "down", and the up and down directions are not limited to the direction of gravity. Furthermore, in this specification, for the surfaces of each component, the surface on the top side is referred to as the "top surface", the surface on the bottom side is referred the "bottom surface", and the surface or wall between a top surface and a bottom surface is referred to as a "side surface" or "side wall".

The semiconductor device 70 includes one or more semiconductor chips 78 such as power semiconductor chips. As an example, the semiconductor chip 78 is provided with an insulated gate bipolar transistor (IGBT) formed on a semiconductor substrate made of silicon or the like.

The semiconductor device 70 includes a circuit substrate 76 and a container portion 72. The circuit substrate 76 is a substrate formed by providing a circuit pattern on an insulated substrate, for example. The semiconductor chip 78 is secured to the circuit substrate 76 via solder or the like. The container portion 72 is formed of an insulating material such as resin. The container portion 72 includes an internal space that houses the semiconductor chip 78, the circuit substrate 76, wiring, and the like. The internal space of the container portion 72 may be filled with a sealing portion 74 that seals the semiconductor chip 78, the circuit substrate 76, the wiring, and the like. The sealing portion 74 is an insulating material such as silicone gel or epoxy resin, for example. In the semiconductor device 70, a plurality of the circuit substrates 76 to which the semiconductor chips 78 are respectively attached may be arranged in the y-axis direction.

The cooling apparatus 10 of the present example includes a case 40 that has a top plate 20, a base plate 64, and a side wall plate 63. The top plate 20 may be a board-shaped metal plate having a top surface 22 and a bottom surface 24 that are parallel to the xy plane. As an example, the top plate 20 is formed of metal including aluminum. The semiconductor device 70 is arranged on the top surface 22 of the top plate 20. The heat generated by the semiconductor chip 78 is transferred to the top plate 20. For example, the circuit substrate 76, a metal plate, and a thermally conductive material such as solder are arranged between the top plate 20 and the semiconductor chip 78. The circuit substrate 76 may be directly secured to the top surface 22 of the top plate 20 by solder or the like. In this case, the container portion 72 is provided surrounding the region where the circuit substrate 76 and the like are arranged on the top surface 22 of the top plate 20. As another example, the semiconductor device 70 may include a metal plate that is exposed in a bottom surface of the container portion 72, the circuit substrate 76 may be secured to the top surface of this metal plate, and this metal plate may be secured to the top surface 22 of the top plate 20.

The base plate 64 is arranged facing the bottom surface 24 of the top plate 20. The base plate 64 includes a top surface 65 that faces the bottom surface 24 of the top plate 20 and a bottom surface 66 that is on the opposite side of the top surface 65. The top surface 65 of the base plate 64 and the bottom surface 24 of the top plate 20 may have a prescribed space therebetween, and may be arranged substantially parallel to each other. The side wall plate 63 is arranged between the top plate 20 and the base plate 64. The side wall plate 63 connects the outer edges of the base plate 64 and the top plate 20. The base plate 64 and the side wall plate 63 may be formed integrally.

The case 40 includes a coolant flow-through portion 92 that is surrounded by the top plate 20, the side wall plate 63, and the base plate 64. The coolant flow-through portion 92 is arranged between the bottom surface 24 of the top plate 20 and the top surface 65 of the base plate 64. The coolant flow-through portion 92 is a region through which a coolant such as water flows. The coolant flow-through portion 92 may be a sealed space that contacts the bottom surface 24 of the top plate 20.

The case 40 of the present example includes a border portion 62 provided surrounding the coolant flow-through portion 92 in the xy plane. The border portion 62 may have a frame shape surrounding the coolant flow-through portion 92 in the xy plane. The border portion 62 is provided extending outward in the xy plane, from the top end of the side wall 63. Here, "outward" means a direction away from the coolant flow-through portion 92. The border portion 62 is arranged closely adhered to the bottom surface 24 of the top plate 20, either directly or indirectly. In this way, the coolant flow-through portion 92 is sealed. Here, being closely adhered "indirectly" refers to a state where the border portion 62 and the bottom surface 24 of the top plate 20 are closely adhered via a sealing agent, adhesive agent, or other material provided between the border portion 62 and the bottom surface 24 of the top plate 20. Furthermore, being "closely adhered" refers to a state where coolant inside the coolant flow-through portion 92 does not leak out from these closely adhered portions.

In the example of FIG. 1, the border portion 62, the side wall plate 63, and the base plate 64 are formed integrally, and the top plate 20 is secured thereto by brazing or the like. As another example, the top plate 20 and the side wall plate 63 may be formed integrally. In this case, the case 40 does not need to include the border portion 62. Furthermore, the base plate 64 may be secured to the side wall plate 63 by brazing or the like.

A plurality of cooling pins 94 are arranged inside the coolant flow-through portion 92. The plurality of cooling pins 94 in the present example are secured to the bottom surface 24 of the top plate 20. The cooling pins 94 and the top plate 20 are thermally connected. In this way, the heat generated by the semiconductor chip 78 and the like is transferred to the cooling pins 94. By having the coolant pass near the cooling pins 94, the heat generated by the semiconductor chip 78 is transferred to the coolant. In this way, it is possible to cool the semiconductor device 70.

A plurality of first cooling pins and a plurality of second cooling pins that are longer than the first cooling pins are included in the plurality of cooling pins 94, but in the example of FIG. 1, the lengths of all of the cooling pins 94 are schematically shown as being the same. The length of a cooling pin 94 refers to the length in a thickness direction (the z-axis direction in the present example) from the top plate 20 toward the base plate 64. A relatively large spatial region occurs between the base plate 64 and the bottom ends of the first cooling pins that are shorter than the second cooling pins. By providing this spatial region, it is easy for foreign matter or the like contained in the coolant to pass through. Therefore, it is possible to prevent the flow of the coolant from being inhibited due to foreign matter or the like becoming stuck between the cooling pins 94.

In the present example, brazing is performed between the top plate 20 and the border portion 62. As an example, the top plate 20 and the border portion 62 are formed by material of the same composition (metal in the present example), and the brazing material is formed by metal with a lower melting point than the top plate 20 and the like.

As described above, the base plate 64 is arranged to face the top plate 20 in the z-axis direction and to include the coolant flow-through portion 92 between itself and the bottom surface 24 of the top plate 20. The base plate 64 may refer to a portion parallel to the top plate 20, among portions of the case 40 arranged at a distance from the top plate 20. Two or more opening portions 42 that draw in or expel coolant to or from the coolant flow-through portion 92 are provided in the base plate 64 of the present example. In the cross section shown in FIG. 1, only one opening portion 42 is shown. As another example, the opening portions 42 may be provided in the side wall plate 63.

A through-hole through which a screw or the like for fastening is inserted may be provided in the top plate 20. The through-hole may be used to secure the semiconductor module 100 to an external apparatus. The through-hole is provided in a region where the top plate 20 and the border portion 62 are arranged overlapping in the z-axis direction to be closely adhered either directly or indirectly.

At least some of the cooling pins 94 are provided between the two opening portions 42. One of the opening portions 42 provided sandwiching some of the cooling pins 94 functions as an inlet for introducing the coolant to the coolant flow-through portion 92, and the other opening portion 42 functions as an outlet for expelling the coolant from the coolant flow-through portion 92. A user can suitably select which opening portion 42 functions as an inlet and which functions as an outlet.

Figure 2:
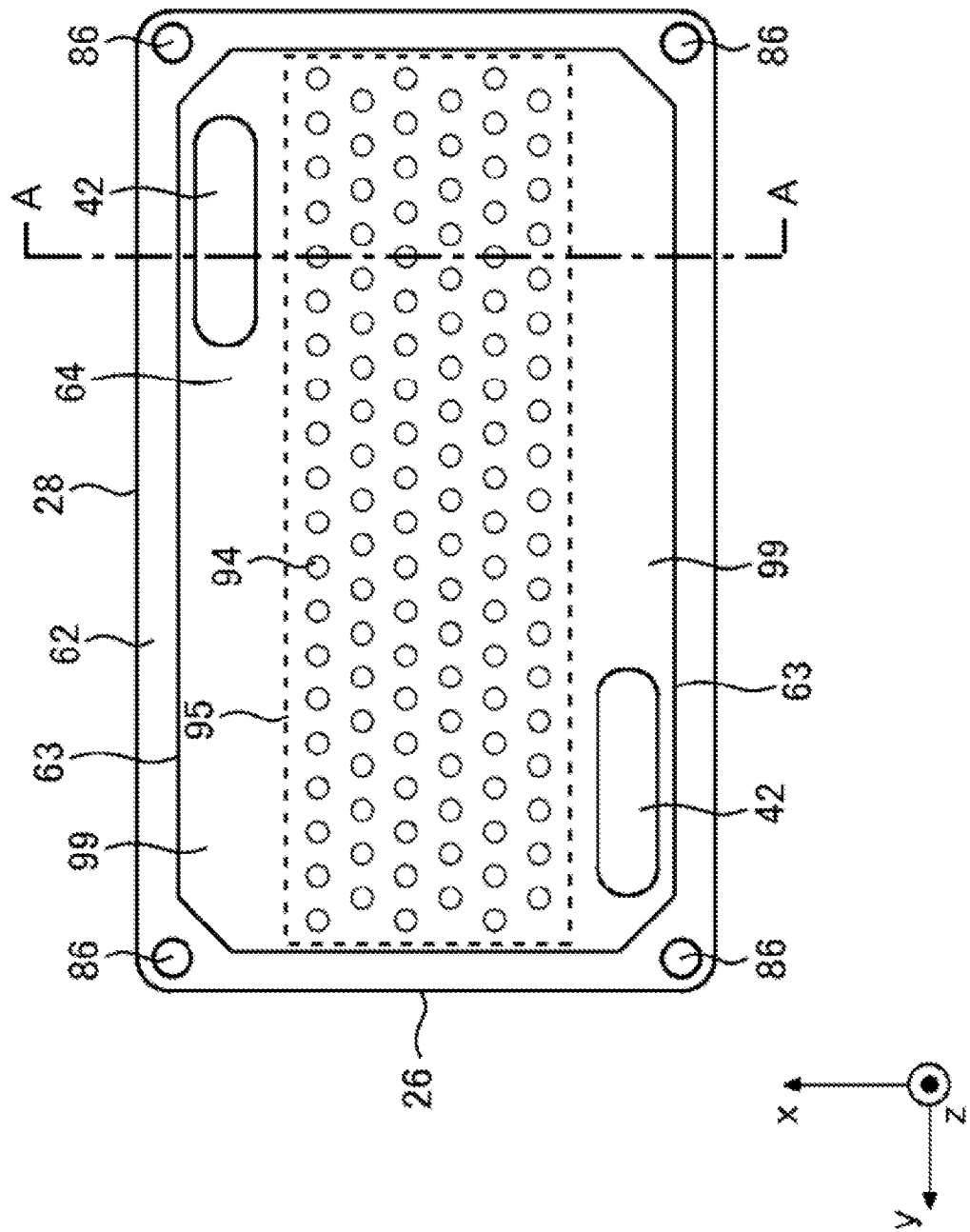
FIG. 2 shows an overview of the arrangement of the plurality of cooling pins 94 when seen from above (xy plane).

FIG. 2 shows an overview of the arrangement of the plurality of cooling pins 94 when seen from above (xy plane). In FIG. 2, the base plate 64 and the border portion 62 are shown together. The border portion 62 of the present example includes a set of opposing edges 26 and a set of opposing edges 28 when seen from above. The border portion 62 of the present example includes short edges 26 and long edges 28. If the case 40 does not include the border portion 62, the base plate 64 may include the edges 26 and 28. The cross section of the cooling apparatus 10 shown in FIG. 1 corresponds to a cross section along the line A-A shown in FIG. 2.

A through-hole 86 is provided at each corner of the border portion 62. The border portion 62 is shaped as a frame surrounding a prescribed region, in the xy plane. The base plate 64 is arranged inside the border portion 62 in the xy plane. The two opening portions 42 are provided in the base plate 64. The opening portions 42 of the present example are arranged at two opposite corners of the base plate 64, but the positions of the opening portions 42 are not limited to this.

The plurality of cooling pins 94 are arranged in a fin region 95 sandwiched between the two opening portions 42. The fin region 95 may include sides parallel to the long edges 28 and sides parallel to the short edges 26. The fin region 95 of the present example includes a coolant flow path 99 with a prescribed width between the portions of the side wall plate 63 along the long edges 28. The coolant flow path 99 of the present example extends in the y-axis direction along the long edges 28. The coolant introduced from an opening portion 42 flows in the y-axis direction along the coolant flow path 99, while also passing through the plurality of cooling pins 94 and flowing in a direction toward the other opening portion 42. Due to such a configuration, the coolant passes through the entire fin region 95.

The fin region 95 is provided in a region overlapping with at least the semiconductor chip 78. The fin region 95 may be provided in a region overlapping with the circuit substrate 76. The fin region 95 may be provided over a wider range than the circuit substrate 76. Due to such a configuration, the semiconductor device 70 can be cooled. The fin region 95 does not need to be provided at a position overlapping with the opening portion 42.

Figure 3:
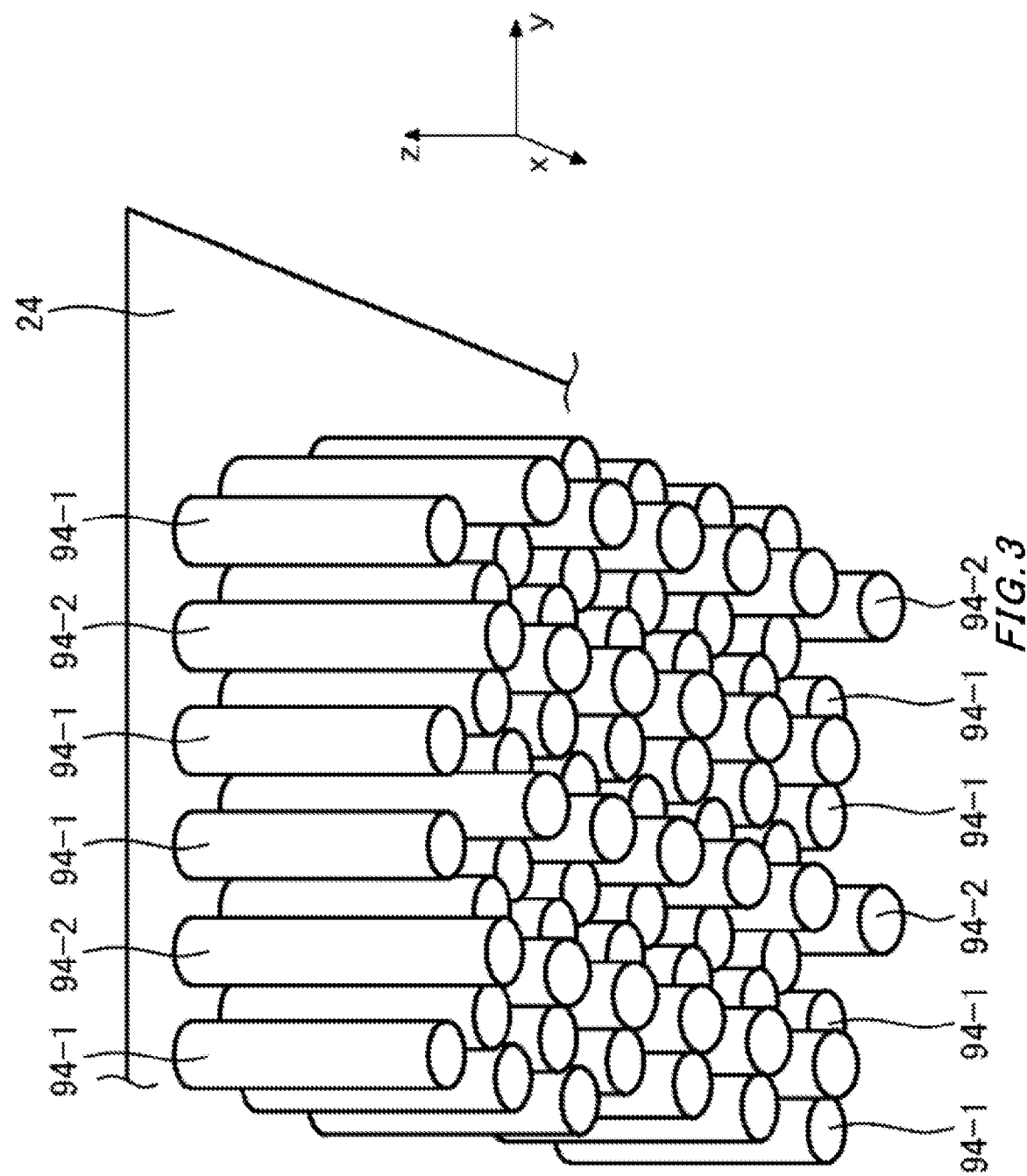
FIG. 3 is a perspective view of an example of the plurality of cooling pins 94.

FIG. 3 is a perspective view of an example of the plurality of cooling pins 94. Each cooling pin 94 is shaped as a pillar whose long dimension is in the thickness direction (z-axis direction). In FIG. 3, each cooling pin 94 is shown schematically as a circular pillar, but the shapes of the cooling pins 94 are not limited to this. Each cooling pin 94 may instead be shaped as a conical table or polygonal pillar.

The cooling apparatus 10 includes a plurality of first cooling pins 94-1 and a plurality of second cooling pins 94-2. Each cooling pin 94 is secured to the bottom surface 24 of the top plate 20, in the coolant flow-through portion 92.

The second cooling pins 94-2 are longer in the thickness direction (z-axis direction) than the first cooling pins 94-1. In other words, the distance between a second cooling pin 94-2 and the top surface 65 of the base plate 64 is less than the distance between a first cooling pin 94-1 and the top surface 65 of the base plate 64. The bottom end of each second cooling pin 94-2 may contact the top surface 65 of the base plate 64.

The first cooling pins 94-1 may be arranged with a two-dimensional distribution in at least two directions, on the bottom surface 24 of the top plate 20. The number of first cooling pins 94-1 arranged per unit area in the xy plane may be uniform across the entire fin region 95, or may be different. The first cooling pins 94-1 may be arranged at uniform intervals in a prescribed direction in the xy plane, or may be arranged at non-uniform intervals.

By providing the first cooling pins 94-1, it is possible to provide a relatively large spatial region between the bottom ends of the cooling pins 94 and the top surface 65 of the base plate 64. Therefore, it becomes easy for foreign matter to pass through this spatial region, and it is possible to prevent the foreign matter from remaining inside the fin region 95. Therefore, it is possible to reduce uneven flow of the coolant caused by the foreign matter, and to reduce the pressure loss occurring when the coolant flows through.

Figure 4:
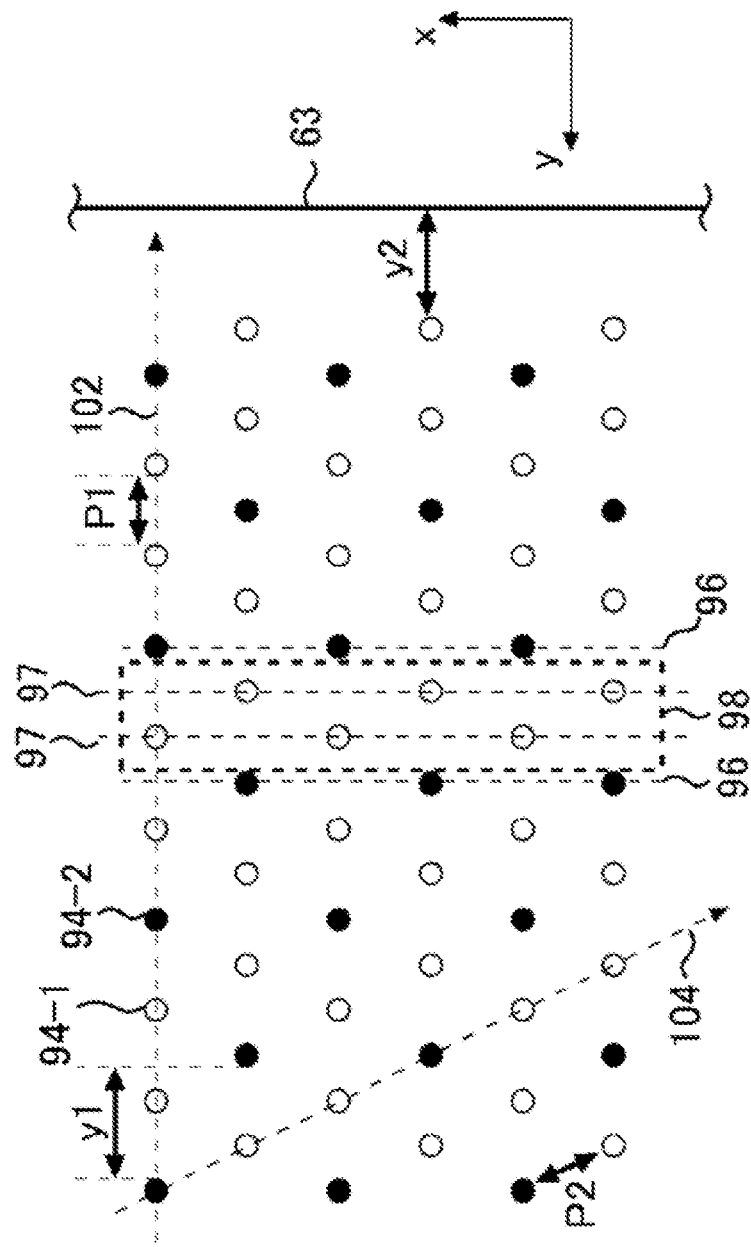
FIG. 4 shows an example of an arrangement of first cooling pins 94-1 and second cooling pins 94-2 in the xy plane.

FIG. 4 shows an example of an arrangement of the first cooling pins 94-1 and the second cooling pins 94-2 in the xy plane. In FIG. 4, only a portion of the fin region 95 is shown. In FIG. 4, the first cooling pins 94-1 are shown by white circles and the second cooling pins 94-2 are shown by black circles. The white circles and the black circles are shown at the positions of the cooling pins 94 in the xy plane, and the sizes of the circles do not necessarily match the sizes of the cooling pins 94.

In the present example, one or more first cooling pins 94-1 and one or more second cooling pins 94-2 are arranged in an alternating manner, and this pattern appears repeatedly at least twice, in a first direction in the xy plane parallel to the top plate 20. In the example of FIG. 4, one second cooling pin 94-2 and two first cooling pins 94-1 are arranged in an alternating manner, and this pattern appears repeatedly at least twice, in the first direction shown by the straight line 102. The first direction in the present example is a direction parallel to the y axis (i.e. a direction parallel to the long edges 28).

The period with which the second cooling pins 94-2 are arranged in the first direction may be constant across the entire fin region 95, or may be different. In this way, the first cooling pins 94-1 and second cooling pins 94-2 are arranged repeatedly within the fin region 95, and therefore the spatial region that allows foreign matter to flow therethrough can be arranged repeatedly within the fin region 95. Therefore, it is easy to prevent the foreign matter from remaining within the fin region 95.

Furthermore, one or more first cooling pins 94-1 and one or more second cooling pins 94-2 may be arranged in an alternating manner, and this pattern appears repeatedly at least twice, in a second direction that is different from the first direction. In this way, the patterns of the first cooling pins 94-1 and second cooling pins 94-2 can be arranged repeating two-dimensionally. Therefore, it is easy to prevent the foreign matter from remaining within the fin region 95. In the example of FIG. 4, one second cooling pin 94-2 and two first cooling pins 94-1 are arranged in an alternating manner, and this pattern appears repeatedly at least twice, in the second direction shown by the straight line 104. The second direction in the present example is a direction inclined by 60 degrees relative to the first direction, but the second direction is not limited to this. Furthermore, in the example of FIG. 4, each cooling pin 94 is arranged at a grid point in a triangular grid, when seen from above, but may instead be arranged at each grid point in a rectangular grid. Here, the triangular grid may include a regular triangle grid and an isosceles triangle grid, and the rectangular grid may include a square grid.

The number of first cooling pins 94-1 provided in the fin region 95 may be greater than the number of second cooling pins 94-2. In this case, the foreign matter can easily pass through. Alternatively, the number of first cooling pins 94-1 provided in the fin region 95 may be less than the number of second cooling pins 94-2. In this case, the total surface area of the cooling pins 94 can be increased. The number of first cooling pins 94-1 provided in the fin region 95 may be the same as the number of second cooling pins 94-2.

As shown in FIG. 4, a plurality of first cooling pins 94-1 may be arranged between the second cooling pins 94-2 in at least one of the first direction and the second direction. By arranging the plurality of first cooling pins 94-1 continuously, the width of the spatial region through which the foreign matter passes can be increased, and the foreign matter can easily pass through.

In the example of FIG. 4, the second cooling pins 94-2 are arranged along the x-axis direction. A first cooling pin 94-1 may be arranged between two second cooling pins 94-2 in the x-axis direction, but does not need to be. One or more columns 97 of first cooling pins 94-1 are arranged between respective columns 96, oriented in the x-axis direction, of second cooling pins 94-2. Second cooling pins 94-2 are not arranged between any two first cooling pins 94-1 in each column 97.

In this way, by arranging the relatively short first cooling pins 94-1 continuously in the x-axis direction, a spatial region 98 can be provided continuously in a manner to traverse the fin region 95 in a prescribed linear direction. In the example of FIG. 4, the linear direction along which the spatial region 98 is provided is the x-axis direction. The spatial region 98 traversing the fin region 95 refers to the spatial region 98 being provided continuously from one end portion of the fin region 95 to another end portion.

The spatial region 98 is a space in contact with the top surface 65 of the base plate 64. The space between the first cooling pins 94-1 and the top surface 65 of the base plate 64 is included in the spatial region 98. By having the spatial region 98 traverse the fin region 95, it becomes even easier to expel foreign matter that has intruded into the fin region 95. In the present example, the spatial region 98 traverses the fin region 95 in the x-axis direction, but as another example, the spatial region 98 may traverse the fin region 95 in a linear direction that is different from the x-axis direction. However, the spatial region 98 preferably traverses the fin region 95 in a manner to connect one coolant flow path 99 with another coolant flow path 99.

In the present example, the intervals between cooling pins 94 in the first direction (straight line 102) are a first interval P1. Furthermore, the intervals between cooling pins 94 in the second direction (straight line 104) are a second interval P2. The interval between two cooling pins 94 refers to the shortest distance between end portions of the two cooling pins 94. The second interval P2 may be the same as the first interval P1, or may be different. Furthermore, a third interval between two columns 96 of second cooling pins 94-2 is y1. In the present example, the third interval y1 corresponds to the width of the spatial region 98 in the y-axis direction.

The distance between the side wall plate 63 and the cooling pin 94 arranged at the end in the longitudinal direction (y-axis direction in the present example) of the top plate 20 and the base plate 64 is y2. The distance y2 may be at least double the first interval P1. In this way, it is easy for foreign matter to pass through between the side wall plate 63 and the fin region 95. The distance y2 may be at least three times, or at least four times, the first interval P1.

Figure 5:
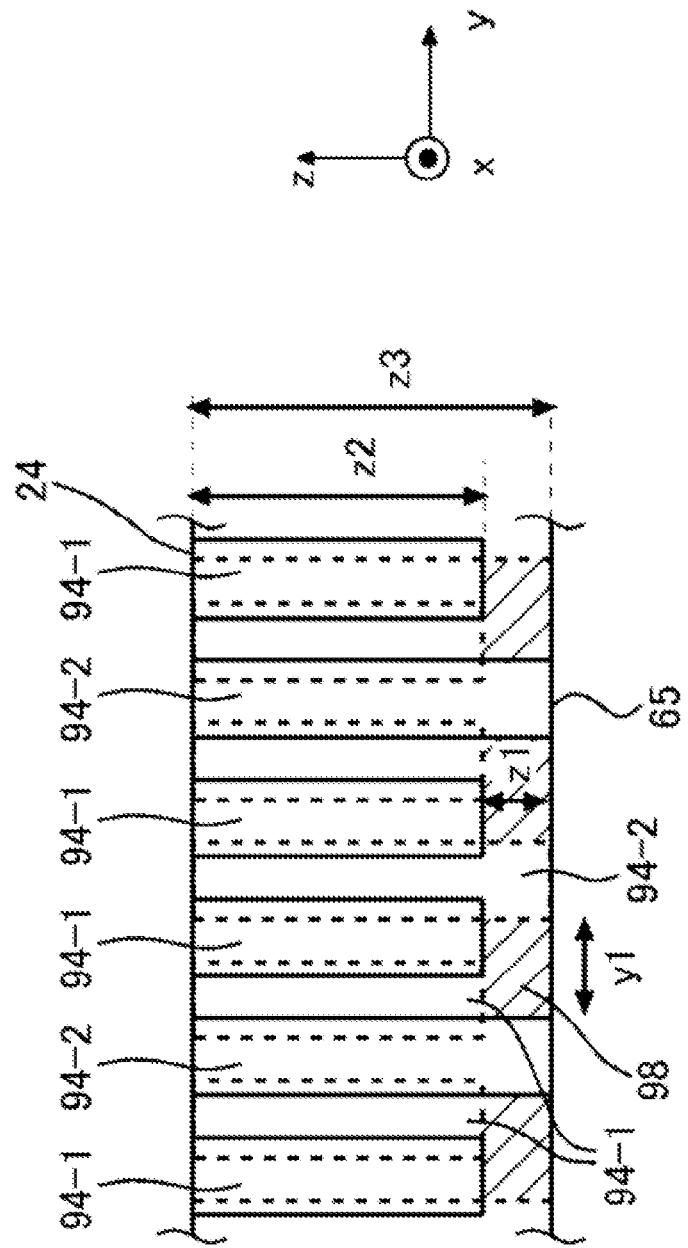
FIG. 5 is a diagram for describing the spatial region 98.

FIG. 5 is a diagram for describing the spatial region 98. In FIG. 5, the plurality of cooling pins 94 arranged along the y axis are shown by solid lines, and the cooling pins 94 arranged deeper in the x-axis direction than these cooling pins 94 are shown by broken lines.

As shown in FIG. 4, the second cooling pins 94-2 are arranged in columns 96 oriented in the x-axis direction. First cooling pins 94-1 are arranged between the columns 96. Therefore, the spatial region 98 extending in the x-axis direction is provided between columns 96 of second cooling pins 94-2. In FIG. 5, diagonal line hatching is shown in the spatial region 98.

The length of the spatial region 98 in the thickness direction (z-axis direction) is z1. The length z1 corresponds to the distance between the top surface 65 of the base plate 64 and the bottom ends of the first cooling pins 94-1. The length z1 is preferably greater than or equal to 1 mm. In this way, the foreign matter can easily pass through. The length z1 may be greater than or equal to 2 mm, or greater than or equal to 3 mm. A length z2 of each first cooling pin 94-1 may be greater than or equal to half of a distance z3 between the bottom surface 24 of the top plate 20 and the top surface 65 of the base plate 64 (i.e. the thickness of the coolant flow-through portion 92), or may be greater than or equal to ¾ of the distance z3. By ensuring sufficient length for the first cooling pins 94-1, it is possible to efficiently disperse heat while easily passing the foreign matter.

As shown in FIG. 5, each cooling pin 94 may have a cross section in the xy plane with an approximately constant pillar shape. Furthermore, at least some of the cooling pins 94 may have a tapered shape in which the cross-sectional area becomes smaller closer to the base plate 64. In this way, it is easy for foreign matter that has intruded into the fin region 95 to move in the direction of the spatial region 98. Each first cooling pin 94-1 may have a tapered shape.

Furthermore, the width y1 of the spatial region 98 in the y-axis direction is preferably greater than or equal to 1 mm. In this way, foreign matter can easily pass through. The width y1 may be greater than or equal to 2 mm, or greater than or equal to 3 mm.

Figure 6:
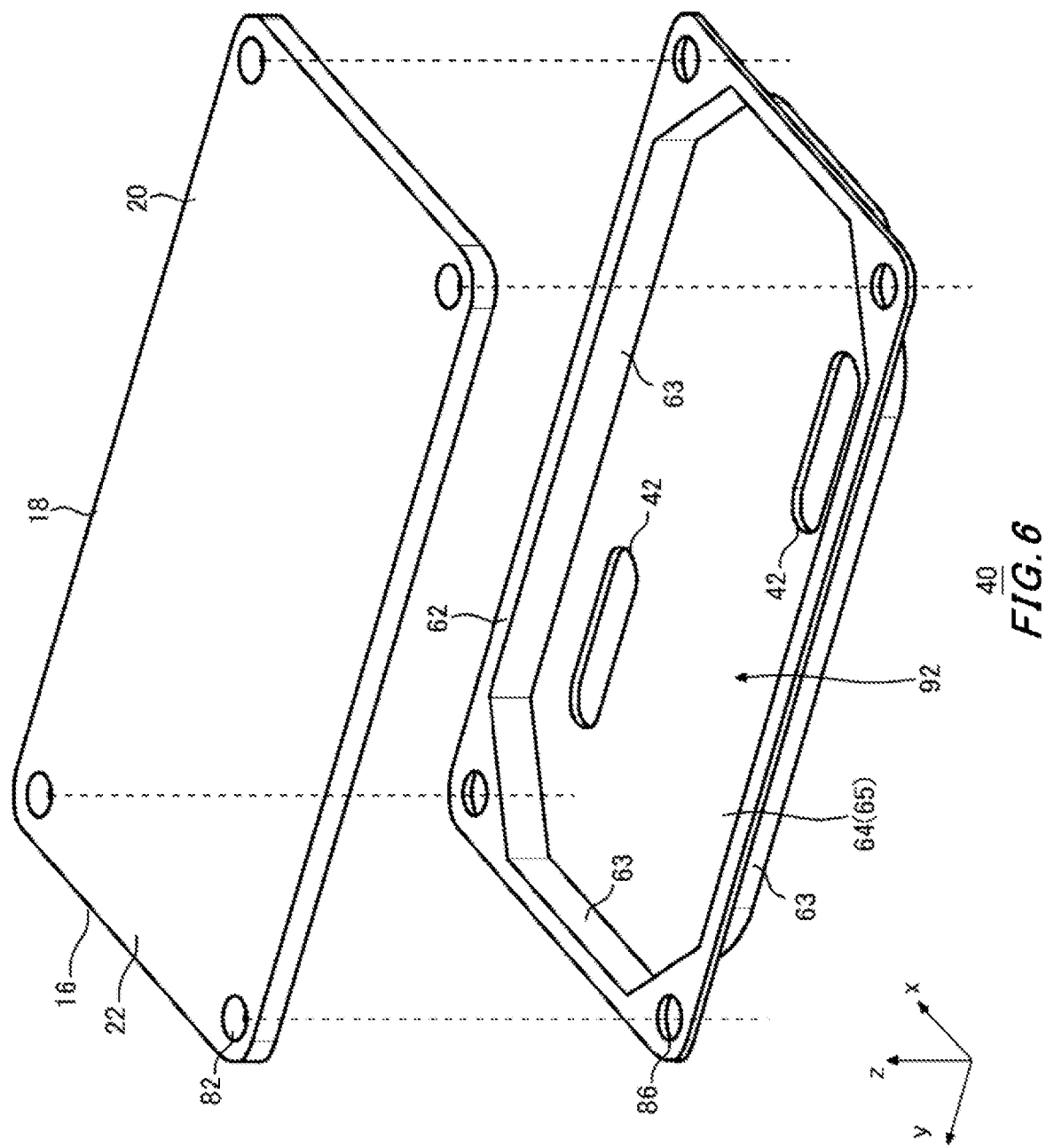
FIG. 6 is a perspective view in which the top plate 20 is shown separated from the case 40.

FIG. 6 is a perspective view in which the top plate 20 is shown separated from the case 40. The top plate 20 includes a set of opposing short edges 16 and a set of opposing long edges 18 in the xy plane. The top plate 20 of the present example has a substantially rectangular shape including the edges 16 and the edges 18. In the present example, the short edges 16 are edges parallel to the x axis, and the long edges 18 are edges parallel to they axis.

The top plate 20 is provided with a through-hole 82, which is a portion of a through-hole used to secure the semiconductor module 100 to an external apparatus. In the present example, through-holes 82 are provided at the four corners of the top plate 20, but the number and positions of the through-holes 82 are not limited to this. Furthermore, the shape of the top plate 20 is not limited to a rectangular shape such as shown in FIG. 6. The top plate 20 may include portions protruding from each edge in the xy plane. The through-holes 82 may be provided in these protruding portions.

In the present example, the border portion 62 and the top plate 20 have approximately the same outer shape in the xy plane. In FIG. 6, positions where the top plate 20 and border portion 62 overlap when secured by brazing or the like are shown by dashed lines. In FIG. 6, the cooling pins 94 arranged in the coolant flow-through portion 92 are omitted. Furthermore, the brazing material between each member is omitted.

As shown in FIG. 6, the border portion 62 is arranged surrounding the coolant flow-through portion 92 and, together with the top plate 20, the side wall plate 63, and the base plate 64, seals the coolant flow-through portion 92. The coolant flow-through portion 92 is defined by the bottom surface 24 of the top plate 20 and the top surface 65 and side wall plate 63 of the base plate 64.

Furthermore, the top plate 20 and the base plate 64 may have the same thickness. The border portion 62, the side wall plate 63, and the base plate 64 may be formed by forging a single piece of plate-shaped metal, or may be formed using another method. The forging is a method for machining a metal plate into a prescribed shape by performing pressing or compression using a mold or the like with a prescribed shape.

Figure 7:
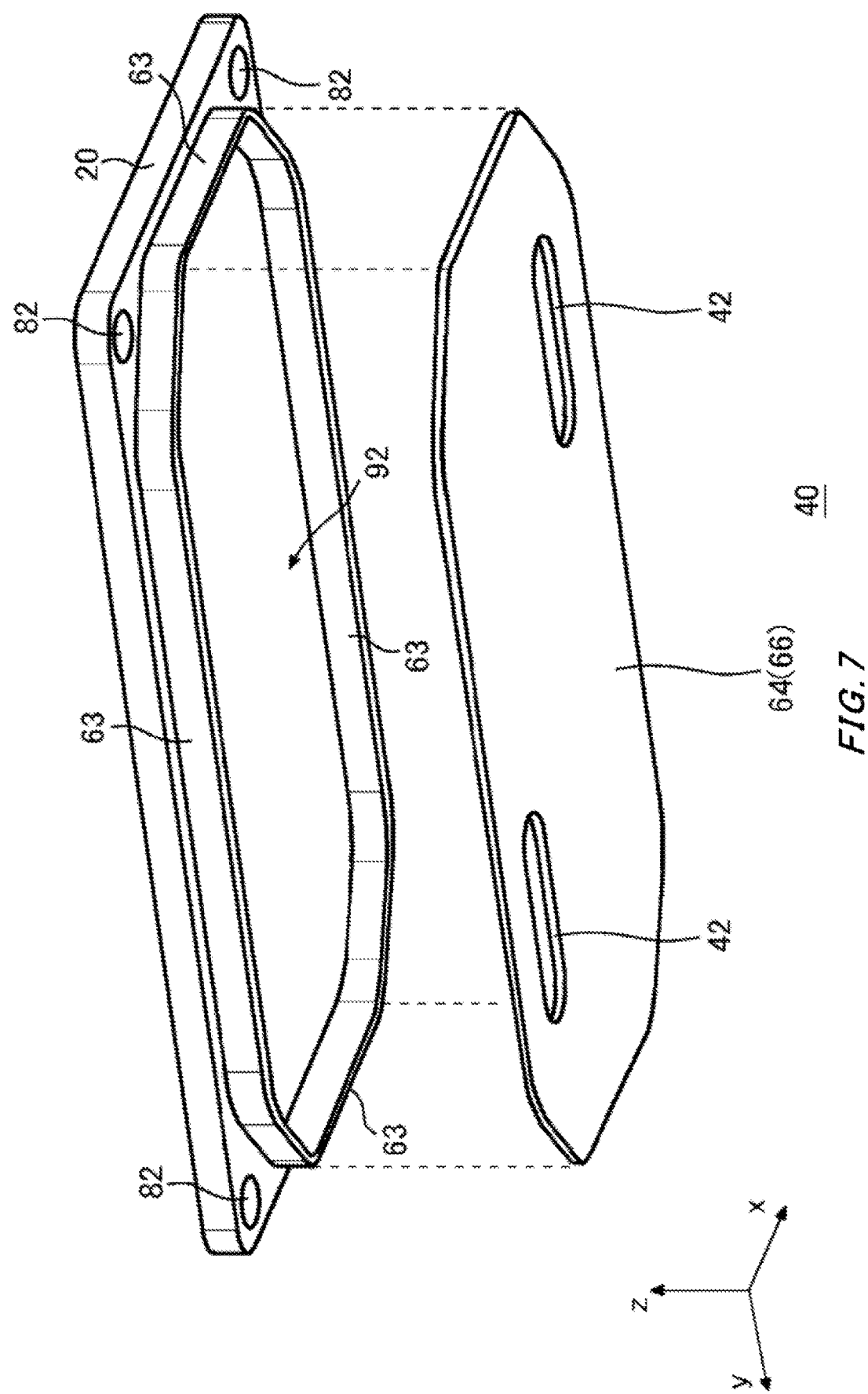
FIG. 7 is a perspective view another example of the case 40.

FIG. 7 is a perspective view of another example of the case 40. In the case 40 of the present example, the top plate 20 and the side wall plate 63 are formed integrally. The base plate 64 is secured to the bottom end of the side wall plate 63 by brazing or the like. In the present example, the top plate 20 and the side wall plate 63 may be formed by forging or by another method.

Figure 8:
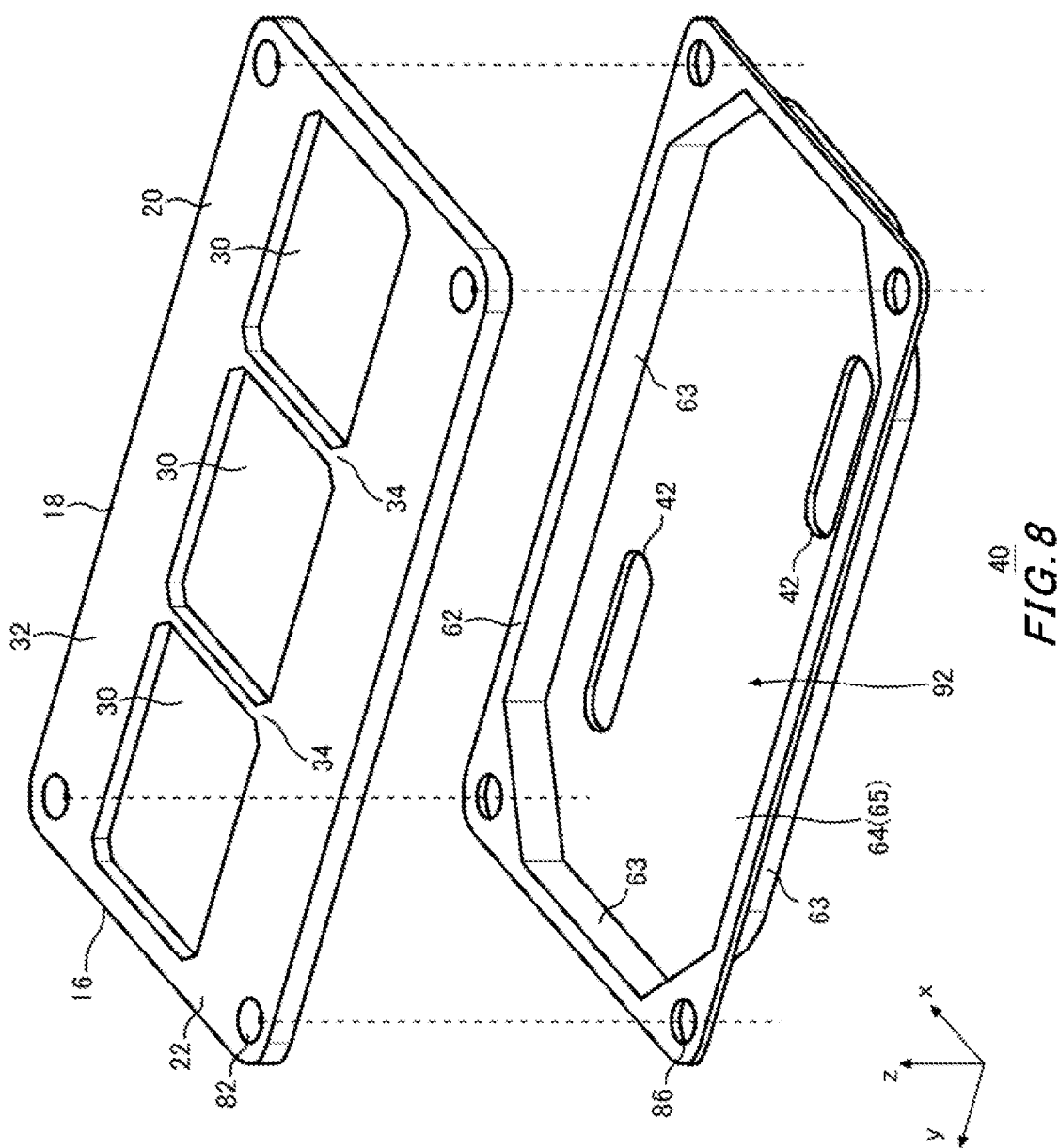
FIG. 8 is a perspective view another example of the case 40.

FIG. 8 is a perspective view of another example of the case 40. In FIG. 8, the case 40 is shown in a state where the top plate 20 has been separated therefrom.

Figure 9:
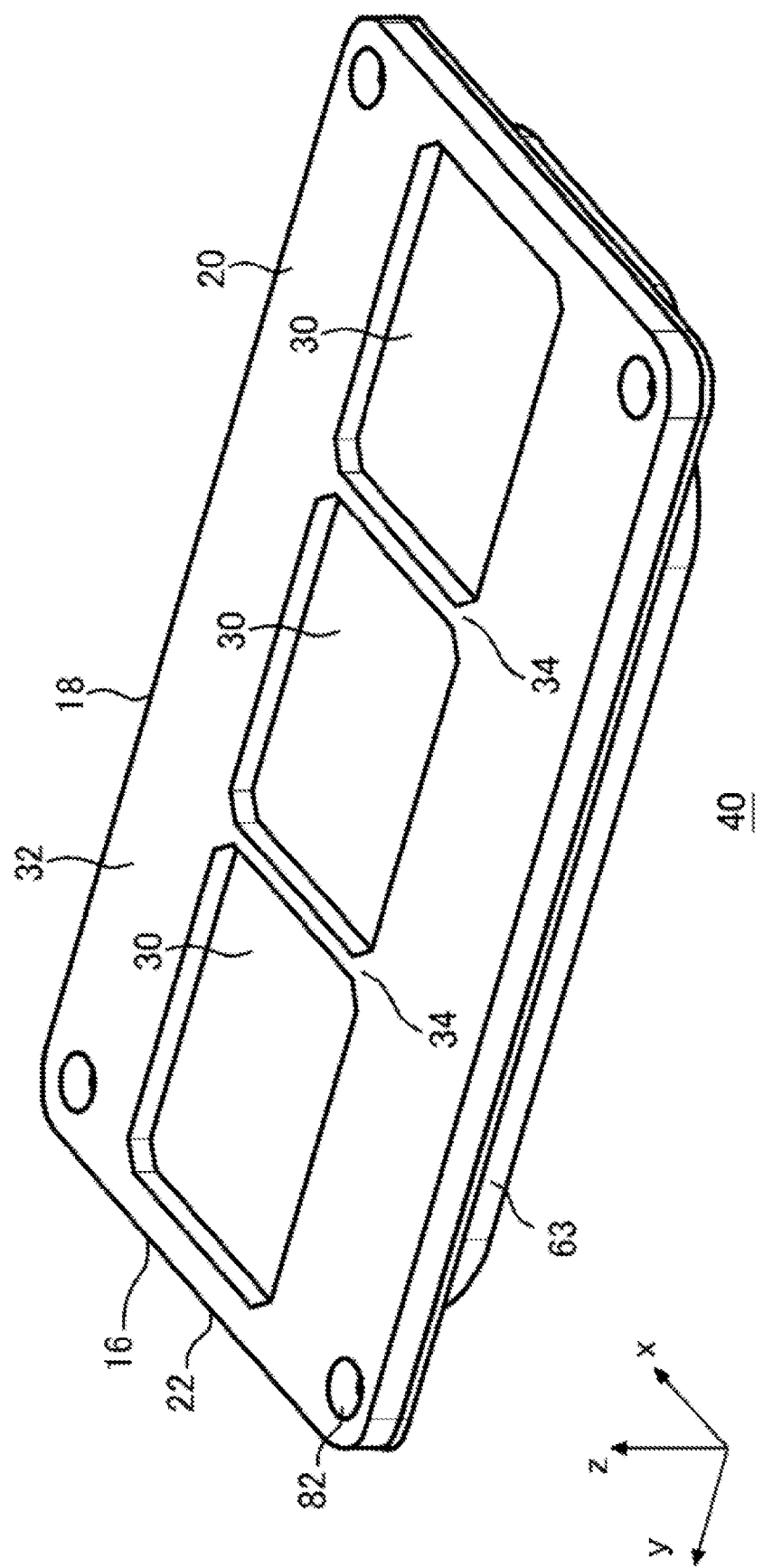
FIG. 9 is a perspective view of the case 40 in a state where the top plate 20 is secured thereto.

FIG. 9 is a perspective view of the case 40 in a state where the top plate 20 is secured thereto. In the case 40 of the present example, the top plate 20 has a different structure. The other structures are the same as in the case 40 described in any of FIGS. 1 to 7.

The top plate 20 of the present example includes one or more recessed portions 30 in the top surface 22. The thickness of the recessed portion 30 in the thickness direction of the top plate 20 (z-axis direction) is less than the thickness of the top plate 20 in regions other than the recessed portion 30. It should be noted that the recessed portion 30 does not penetrate entirely through the top plate 20.

A peripheral portion 32 that surrounds the recessed portion 30 is provided on the top plate 20. The peripheral portion 32 may be provided with a ring shape along the edges 16 and 18 of the top plate 20. The thickness of the top plate 20 in the z-axis direction at the peripheral portion 32 is greater than the thickness of the top plate 20 in the z-axis direction in at the recessed portion 30.

The circuit substrate 76, the semiconductor chip 78, and the like shown in FIG. 1 are arranged in the recessed portion 30. Furthermore, the recessed portion 30 is arranged in at least part of a region overlapping with the first cooling pins 94-1 or the second cooling pins 94-2 (i.e. the fin region 95). The recessed portion 30 overlapping with the fin region 95 refers to at least a partial region of the recessed portion 30 overlapping with the fin region 95 when the recessed portion 30 and the fin region 95 are projected onto the same xy plane. The entire region of the recessed portion 30 is preferably arranged overlapping with the fin region 95. Both the first cooling pins 94-1 and the second cooling pins 94-2 are preferably arranged in a region overlapping with the recessed portion 30.

By providing the recessed portion 30, it is possible to reduce the thickness of the top plate 20 between the circuit substrate 76 and the cooling pins 94, and to efficiently transfer the heat generated by the semiconductor device 70 to the cooling pin 94. Furthermore, by increasing the thickness of the top plate 20 at the peripheral portion 32 surrounding the recessed portion 30, it is possible to maintain the mechanical strength of the top plate 20. In this way, deformation of the top plate 20 can be restricted.

If the top plate 20 includes a plurality of the recessed portions 30, an intermediate region 34 is provided between two recessed portions 30. The intermediate region 34 is a region between the circuit substrates 76 arranged respectively in the recessed portions 30. A plurality of recessed portions 30 are arranged in the y-axis direction in the top surface 22 of the top plate 20 of the present example. The recessed portions 30 may be arranged to overlap with the center of the top surface 22 of the top plate 20 in the x-axis direction. The center position of the recessed portion 30 in the x-axis direction may match the center position of the top surface 22. The thickness of the top plate 20 at the intermediate region 34 is greater than the thickness of the top plate 20 at the recessed portion 30. The thickness of the top plate 20 at the intermediate region 34 may be the same as the thickness of the top plate 20 at the peripheral portion 32. As an example, the top plate 20 may be a single continuous plate member. In this case, the recessed portion 30 may be formed by forging.

Figure 10:
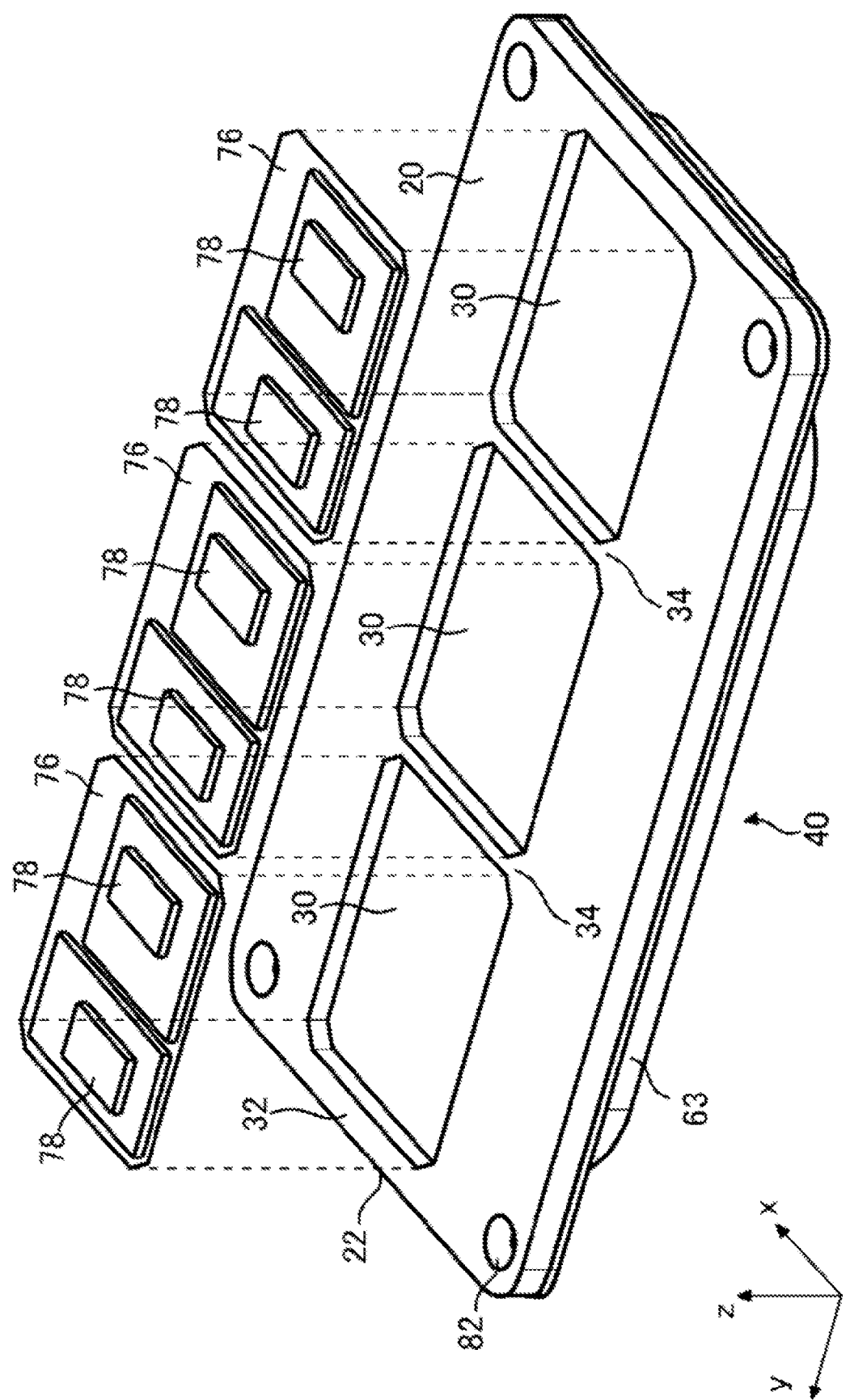
FIG. 10 is a perspective view of an example of the circuit substrate 76 and the semiconductor chip 78 arranged in the recessed portion 30.

FIG. 10 is a perspective view of an example of the circuit substrate 76 and the semiconductor chip 78 arranged in the recessed portion 30. Each recessed portion 30 has one or more circuit substrates 76 arranged therein. In the present example, one circuit substrate 76 is arranged in each recessed portion 30. The shape of the recessed portion 30 in the xy plane may be the same as the shape of the circuit substrate 76 in the xy plane. A lead frame and the like connected to the circuit substrate 76 and the semiconductor chip 78 is omitted from FIG. 10.

Each circuit substrate 76 is provided with one or more semiconductor chips 78. In the present example, circuit substrates 76 and semiconductor chips 78 used in a three-phase inverter are arranged on the top surface 22 of the top plate 20. As an example, a circuit substrate 76 and semiconductor chips 78 for a single phase are arranged in each recessed portion 30.

Figure 11:
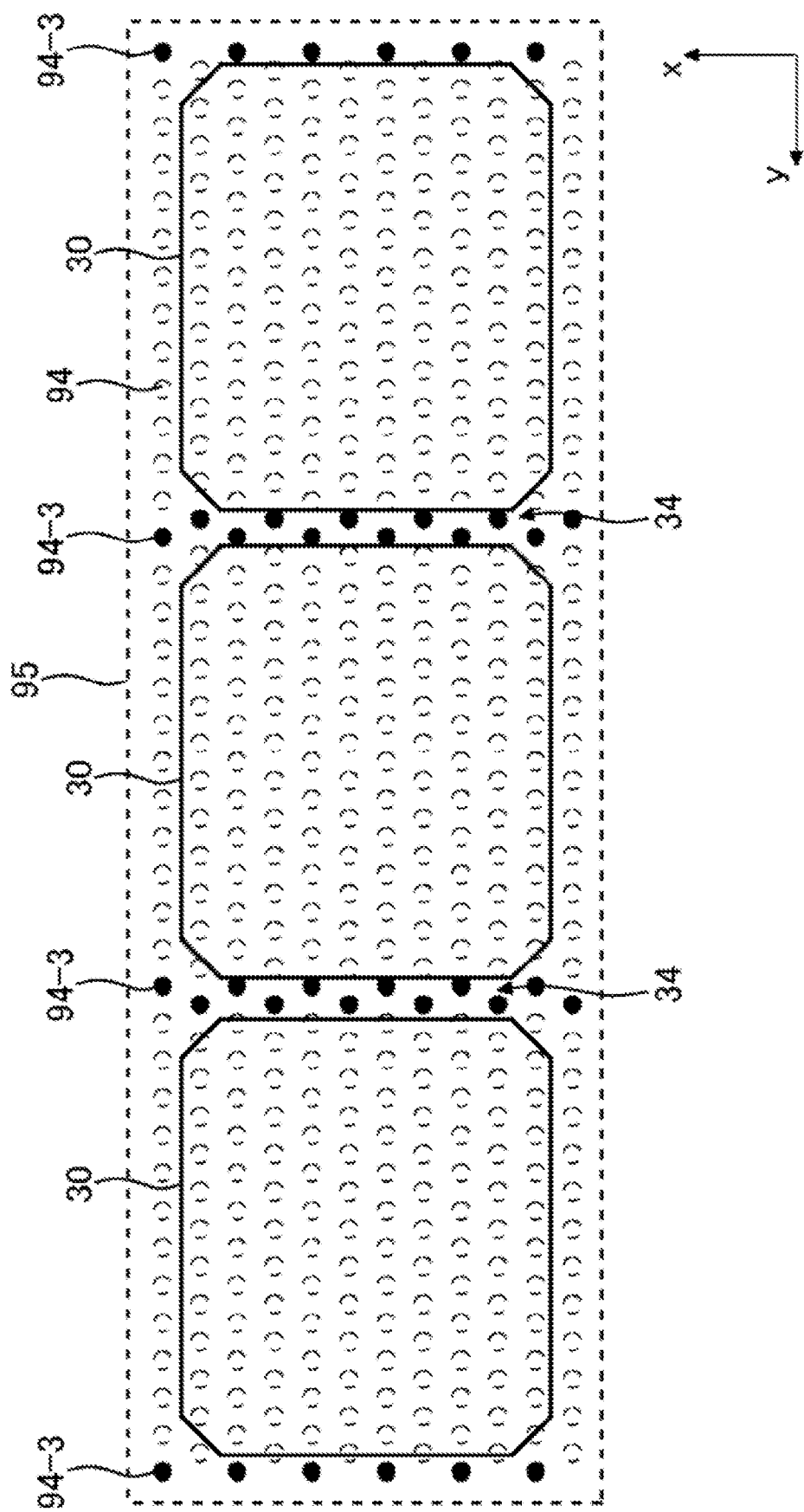
FIG. 11 shows an example of an arrangement of recessed portions 30 and the fin region 95.

FIG. 11 shows an example of an arrangement of recessed portions 30 and the fin region 95. In FIG. 11, the recessed portions 30 and the fin region 95 are projected onto the same xy plane. The recessed portions 30 are shown by solid lines, and the cooling pins 94 are shown by circles formed of broken lines.

As described above, the recessed portions 30 are provided overlapping with the fin region 95. Both first cooling pins 94-1 and second cooling pins 94-2 may be arranged at least in the region overlapping with the recessed portions 30. In this way, it is possible to prevent the accumulation of foreign matter between the cooling pins 94 below the circuit substrates 76. Furthermore, both first cooling pins 94-1 and second cooling pins 94-2 may be arranged at least in the region overlapping with the semiconductor chips 78.

Third cooling pins 94-3, whose lengths in the z-axis direction are less than the lengths of the first cooling pins 94-1, may be arranged at positions overlapping with the intermediate region 34. In FIG. 11, the third cooling pins 94-3 are shows by black circles. It is acceptable for only the third cooling pins 94-3 to be arranged at the positions overlapping with the intermediate region 34, or at least one of first cooling pins 94-1 and second cooling pins 94-2 may be arranged in addition to the third cooling pins 94-3 at the positions overlapping with the intermediate region 34. In the present example, the third cooling pins 94-3 are not arranged in the region overlapping with the recessed portion 30. The length of each third cooling pin 94-3 in the z-axis direction may be less than or equal to half the thickness of the coolant flow-through portion 92. By providing the third cooling pins 94-3, it is possible for foreign matter to pass through even more easily. Furthermore, since the third cooling pins 94-3 are not arranged in the region overlapping with the recessed portions 30, it is possible to reduce a decrease in the heat dispersion capability caused by the shortening of the cooling pins 94. In the case 40 shown in FIGS. 1 to 6, the third cooling pins 94-3 may be provided in regions between two circuit substrates 76.

Furthermore, the third cooling pins 94-3 may also be arranged in the region between the side wall plate 63 and the recessed portions 30, in the y-axis direction. In this way, foreign matter can easily pass through the region contacting the side wall plate 63. Yet further, although not shown in FIG. 11, the third cooling pins 94-3 may also be arranged in the region between the side wall plate 63 and the recessed portions 30, in the x-axis direction as well. As an example, cooling pins 94 that do not overlap with the recessed portions 30 may all be third cooling pins 94-3. The arrangement of the cooling pins 94 that are not third cooling pins 94-3 is the same as the arrangement described in FIG. 4.

Figure 12:
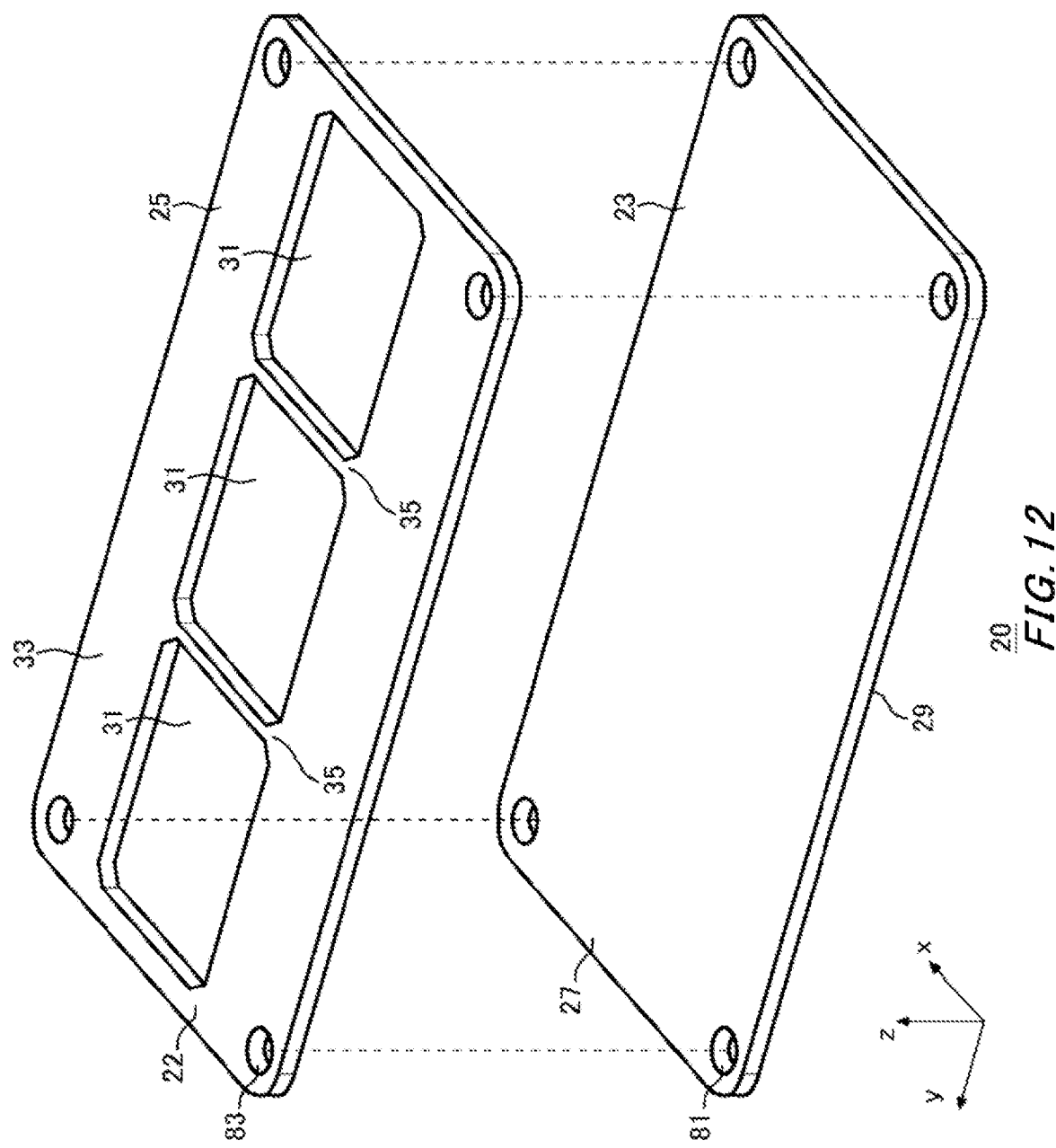
FIG. 12 is a perspective view of an example of the structure of the top plate 20 including the recessed portions 30.

FIG. 12 is a perspective view of an example of the structure of the top plate 20 including the recessed portions 30. The top plate 20 of the present example may be applied to any of the embodiments described in FIGS. 1 to 11. The top plate 20 of the present example includes a lower plate-shaped portion 23 and an upper frame-shaped portion 25. The lower plate-shaped portion 23 is shaped as a plate including a top surface 27 and a bottom surface 29. A plurality of cooling pins 94, including first cooling pins 94-1 and second cooling pins 94-2, are secured to the bottom surface 29. The lower plate-shaped portion 23 is provided with a through-hole 81 that becomes a portion of the through-hole 82.

The upper frame-shaped portion 25 is secured to the top surface 27 of the lower plate-shaped portion 23 by brazing or the like. The upper frame-shaped portion 25 is a frame-shaped member provided with a penetration opening 31 in a region corresponding to the recessed portion 30. The shape of the penetration opening 31 is the same as the shape of the recessed portion 30. The upper frame-shaped portion 25 includes a peripheral portion 33 arranged surrounding the penetration opening 31. The peripheral portion 33 is provided in a region corresponding to the peripheral portion 32 described in FIG. 8.

Furthermore, in a case where a plurality of penetration openings 31 are provided in the upper frame-shaped portion 25, the upper frame-shaped portion 25 includes an intermediate portion 35 between two penetration openings 31. The intermediate portion 35 is provided in the region corresponding to the intermediate region 34 described in FIG. 8. A through-hole 83 that becomes a portion of the through-hole 82 is provided in the upper frame-shaped portion 25. Due to the structure in which the lower plate-shaped portion 23 and the upper frame-shaped portion 25 are provided, it is possible to form the top plate 20 including the recessed portion 30 with a simple process.

Figure 13:
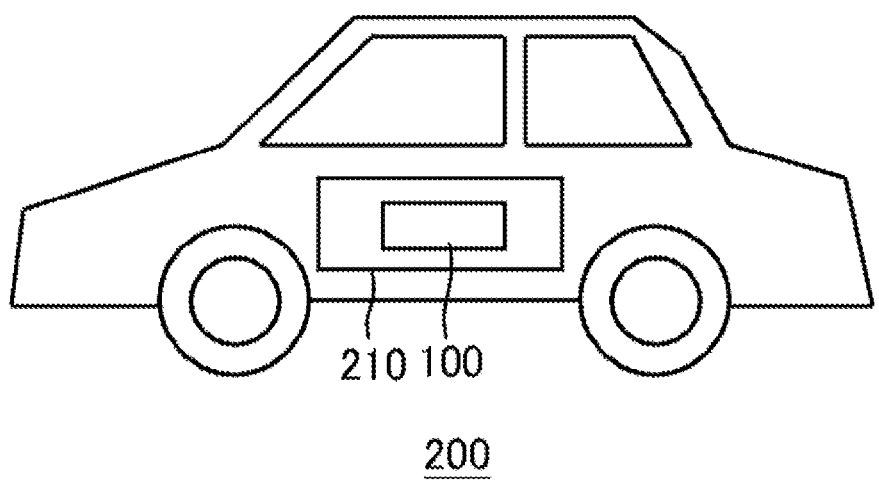
FIG. 13 shows an overview of a vehicle 200 according to one embodiment of the present invention.

FIG. 13 shows an overview of a vehicle 200 according to one embodiment of the present invention. The vehicle 200 is a vehicle that generates at least some of its thrust using electrical power. As an example, the vehicle 200 may be an electric automobile in which all of the thrust is generated by a power-driven device such as a motor, or may be a hybrid vehicle that uses both a power-driven device such as a motor and an internal combustion engine that is driven by fuel such as gasoline.

The vehicle 200 includes a control apparatus 210 (external apparatus) that controls the power-driven device such as the motor. The control apparatus 210 is provided with the semiconductor module 100. The semiconductor module 100 may control the power supplied to the power-driven device.

Figure 14:
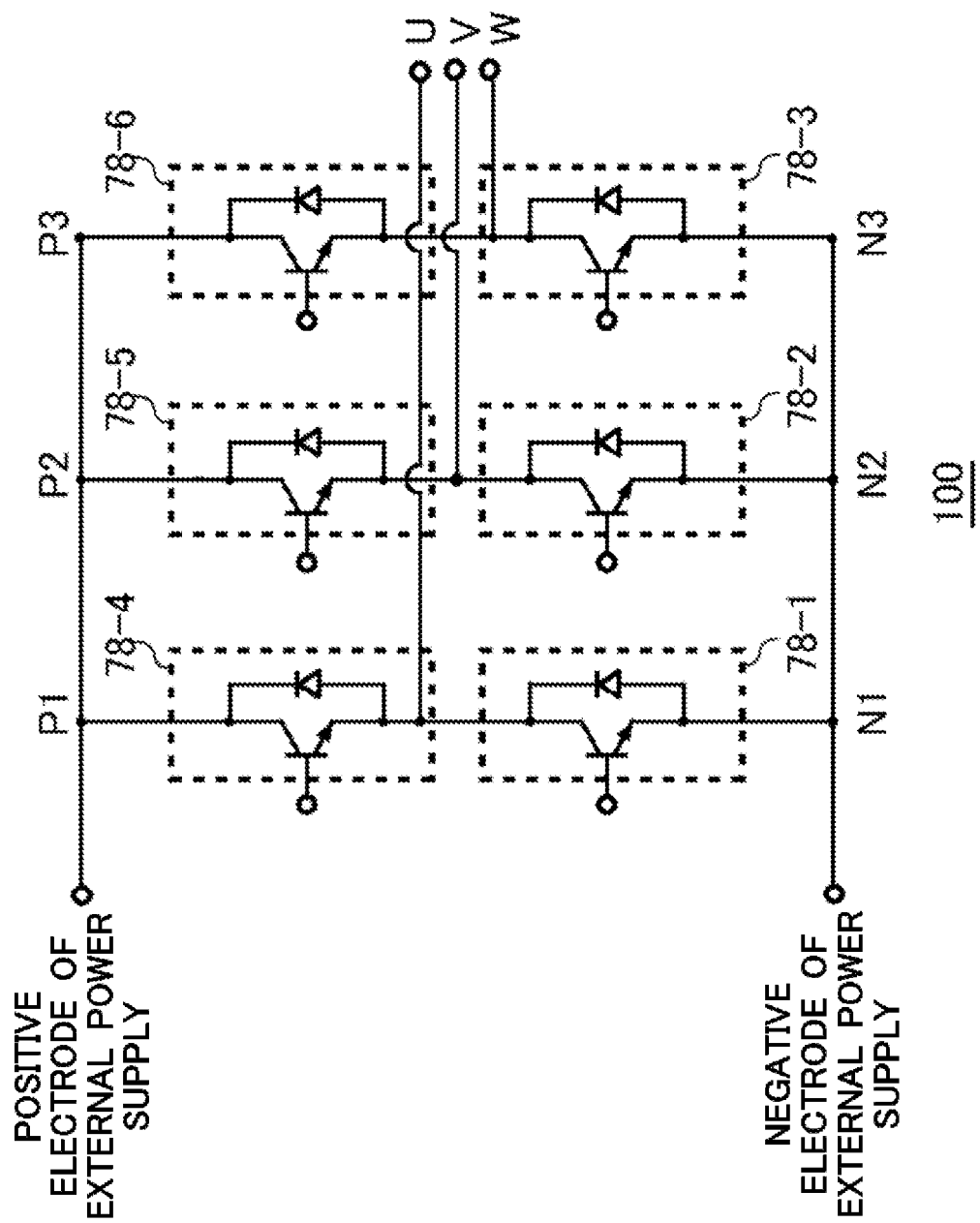
FIG. 14 is a main circuit diagram of the semiconductor module 100 according to one embodiment of the present invention.

FIG. 14 is a main circuit diagram of the semiconductor module 100 according to one embodiment of the present invention. The semiconductor module 100 may be part of an in-vehicle unit that drives a motor of a vehicle. The semiconductor module 100 may function as a three-phase AC inverter circuit that includes output terminals U, V, and W.

A plurality of semiconductor chips 78-1, 78-2, and 78-3 may form a lower arm in the semiconductor module 100, and a plurality of semiconductor chips 78-4, 78-5, and 78-6 may form an upper arm in the semiconductor module 100. One set of semiconductor chips 78-1 and 78-4 may form a leg. One set of semiconductor chips 78-2 and 78-5 and one set of semiconductor chips 78-3 and 78-6 may each form a leg in the same manner. The semiconductor chips 78 are arranged in the recessed portions 30 described above, in leg units.

In the semiconductor chip 78-1, the emitter electrode may be electrically connected to an input terminal N1, and the collector electrode may be connected to the output terminal U. In the semiconductor chip 78-4, the emitter electrode may be electrically connected to the output terminal U, and the collector electrode may be electrically connected to an input terminal P1. Similarly, in the semiconductor chips 78-2 and 78-3, the emitter terminals may be electrically connected to input terminals N2 and N3, respectively, and the collector terminals may be electrically connected to the output terminals V and W, respectively. Furthermore, in the semiconductor chips 78-5 and 78-6, the emitter terminals may be electrically connected to the output terminals V and W, respectively, and the collector terminals may be electrically connected to input terminals P2 and P3, respectively.

Each semiconductor chip 78-1 to 78-6 may be switched alternately by a signal input to the control electrode pad of the semiconductor chip 78. In the present example, each semiconductor chip 78 may generate heat when switching. The input terminals P1, P2, and P3 may be connected to a positive electrode of an external power supply, the input terminals N1, N2, and N3 may be connected to a negative electrode of the external power supply, and the output terminals U, V, and W may be connected to a load. The input terminals P1, P2, and P3 may be electrically connected to each other, and the other input terminals N1, N2, and N3 may be electrically connected to each other.

In the semiconductor module 100, the plurality of semiconductor chips 78-1 to 78-6 may each be an RC-IGBT (reverse-conducting IGBT) semiconductor chip. In an RC-IGBT semiconductor chip, the IGBT and the freewheel diode (FWD) are formed integrally, and the IGBT and FWD may be connected in antiparallel. The plurality of semiconductor chips 78-1 to 78-6 may each include a combination of a transistor, such as a MOSFET or IGBT, and a diode. The chip substrate of the transistor and the diode may be a silicon substrate, a silicon carbide substrate, or a gallium nitride substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A cooling apparatus for a semiconductor module including a semiconductor chip, comprising:
a case that includes a top plate, a base plate, a side wall plate that is arranged between the top plate and the base plate, and a coolant flow-through portion surrounded by the top plate, the base plate, and the side wall plate;
a plurality of first cooling pins secured to the top plate in the coolant flow-through portion of the case; and
a plurality of second cooling pins that are secured to the top plate in the coolant flow-through portion of the case and have lengths in a thickness direction from the top plate toward the base plate that are greater than lengths of the plurality of first cooling pins, wherein
one or more of the plurality of first cooling pins and one or more of the plurality of second cooling pins are arranged in an alternating manner to form a pattern which appears repeatedly at least twice along a first direction in a plane parallel to the top plate, and
a spatial region with a length in the thickness direction greater than or equal to 1 mm is provided between end portions of the plurality of first cooling pins on the base plate side and the base plate.

2. The cooling apparatus according to claim 1, wherein
the plurality of first cooling pins and the plurality of second cooling pins are arranged in a predetermined cooling fin region, and
the spatial region is provided continuously traversing the cooling fin region, in a predetermined linear direction.

3. The cooling apparatus according to claim 2, wherein
width of the spatial region in a direction perpendicular to both the linear direction and the thickness direction is greater than or equal to 1 mm.

4. The cooling apparatus according to claim 1, wherein
one or more of the plurality of first cooling pins and one or more of the plurality of second cooling pins are arranged in an alternating manner, and this pattern appears repeatedly at least twice, along a second direction that is different from the first direction.

5. The cooling apparatus according to claim 4, wherein
the plurality of first cooling pins are arranged between the plurality of second cooling pins in at least one of the first direction and the second direction.

6. The cooling apparatus according to claim 1, wherein
the plurality of first cooling pins and the plurality of second cooling pins are arranged at a predetermined first interval in a longitudinal direction of the top plate, and
a distance between the side wall plate and the cooling pin arranged at an end in the longitudinal direction is greater than or equal to double the first interval.

7. A semiconductor module comprising:
the cooling apparatus according to claim 1; and
a semiconductor device arranged above the top plate.

8. A vehicle comprising the semiconductor module according to claim 7.

9. The cooling apparatus for a semiconductor module including a semiconductor chip, comprising:
a case that includes a top plate, a base plate, a side wall plate that is arranged between the top plate and the base plate, and a coolant flow-through portion surrounded by the top plate, the base plate, and the side wall plate;
a plurality of first cooling pins secured to the top plate in the coolant flow-through portion of the case; and
a plurality of second cooling pins that are secured to the top plate in the coolant flow-through portion of the case and have lengths in a thickness direction from the top plate toward the base plate that are greater than lengths of the plurality of first cooling pins, wherein one or more of the plurality of first cooling pins and one or more of the plurality of second cooling pins are arranged in an alternating manner to form a pattern which appears repeatedly at least twice along a first direction in a plane parallel to the top plate, and the top plate includes a bottom surface to which the plurality of first cooling pins and the plurality of second cooling pins are secured and a top surface opposite the bottom surface, and a recessed portion is provided in at least a portion of a region of the top surface overlapping with the plurality of first cooling pins or the plurality of second cooling pins.

10. The cooling apparatus according to claim 9, wherein the top plate includes a peripheral portion that surrounds the recessed portion, and thickness of the peripheral portion in the thickness direction is greater than thickness of the recessed portion.

11. The cooling apparatus according to claim 10, wherein the top plate is a single continuous plate member.

12. The cooling apparatus according to claim 11, wherein the top plate includes a plurality of recessed portions, each recessed portion being the recessed portion, and an intermediate region sandwiched between two of the recessed portions, and a third cooling pin, whose length in the thickness direction is less than the lengths of the plurality of first cooling pins, is arranged at a position overlapping with the intermediate region.

13. A manufacturing method for manufacturing the cooling apparatus according to claim 11, comprising:
   forming the recessed portion by forging.

14. The cooling apparatus according to claim 10, wherein the top plate includes:
   a lower plate-shaped portion that is shaped as a plate including a top surface and a bottom surface, and has the plurality of first cooling pins and the plurality of second cooling pins secured to the bottom surface thereof; and
   an upper frame-shaped portion that is secured to the top surface of the lower plate-shaped portion and is provided with a penetration opening in a region corresponding to the recessed portion.

15. The cooling apparatus according to claim 14, wherein the top plate includes a plurality of recessed portions, each recessed portion being the recessed portion, and an intermediate portion sandwiched between two of the recessed portions, and a third cooling pin, whose length in the thickness direction is less than the lengths of the plurality of first cooling pins, is arranged at a position overlapping with the intermediate portion.

16. A cooling apparatus for a semiconductor module including a semiconductor chip, comprising:
   a case that includes a top plate, a base plate, a side wall plate that is arranged between the top plate and the base plate, and a coolant flow-through portion surrounded by the top plate, the base plate, and the side wall plate;
   a plurality of first cooling pins secured to the top plate in the coolant flow-through portion of the case; and
   a plurality of second cooling pins that are secured to the top plate in the coolant flow-through portion of the case and have lengths in a thickness direction from the top plate toward the base plate that are greater than lengths of the plurality of first cooling pins, wherein
   one or more of the plurality of first cooling pins and one or more of the plurality of second cooling pins are arranged in an alternating manner to form a pattern which appears repeatedly at least twice along a first direction in a plane parallel to the top plate, and
   the top plate has a semiconductor chip mounted thereon.

17. The cooling apparatus for a semiconductor module including a semiconductor chip according to claim 16, wherein:
   the base plate has a flat surface, and
   a first distance between the plurality of second cooling pins and the base plate is shorter than a second distance between the plurality of first cooling pins and the base plate.

* * * * *